(12) United States Patent
Allen-Ware et al.

(10) Patent No.: US 10,049,957 B2
(45) Date of Patent: Aug. 14, 2018

(54) ON-CHIP CONTROL OF THERMAL CYCLING

(75) Inventors: Malcolm Scott Allen-Ware, Austin, TX (US); John Bruce Carter, Austin, TX (US); Elmootazbellah Nabil Elnozahy, Austin, TX (US); Wei Huang, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 773 days.

(21) Appl. No.: 13/040,094

(22) Filed: Mar. 3, 2011

(65) Prior Publication Data

US 2012/0223764 A1 Sep. 6, 2012

(51) Int. Cl.
*H01L 23/34* (2006.01)

(52) U.S. Cl.
CPC ...... *H01L 23/34* (2013.01); *H01L 2924/0002* (2013.01)

(58) Field of Classification Search
CPC ....................................................... G05F 3/227
USPC ................................................. 307/117, 651
See application file for complete search history.

(56) References Cited

U.S. PATENT DOCUMENTS

| 7,068,093 | B2 | 6/2006 | Morishita et al. |
| 2006/0034343 | A1* | 2/2006 | Rotem ................... G06F 1/206 374/45 |
| 2007/0001697 | A1* | 1/2007 | Dobberpuhl et al. ........ 324/763 |
| 2008/0236175 | A1* | 10/2008 | Chaparro Monferrer et al. ........ 62/3.2 |
| 2009/0295458 | A1* | 12/2009 | Kameyama et al. ......... 327/512 |
| 2009/0316750 | A1 | 12/2009 | Sheng et al. |
| 2011/0205888 | A1* | 8/2011 | Laitinen et al. .............. 370/230 |

\* cited by examiner

*Primary Examiner* — Kyle R Quigley
(74) *Attorney, Agent, or Firm* — Garg Law Firm, PLLC; Rakesh Garg; Mercedes L. Hobson

(57) ABSTRACT

A method, system, and computer program product for on-chip control of thermal cycling in an integrated circuit (IC) are provided in the illustrative embodiments. A first circuit is configured on the IC for adjusting a first voltage being applied to a first part of the IC. A first temperature of the first part is measured at a first time. A determination is made that the first temperature is outside a temperature range defined by an upper temperature threshold and a lower temperature threshold. The first voltage is adjusted by reducing the first voltage when the first temperature exceeds the upper temperature threshold and by increasing the first voltage when the first temperature is below the lower temperature threshold, thereby causing the first temperature of the first part to attain a value within the temperature range.

20 Claims, 5 Drawing Sheets

ON-CHIP CONTROL OF THERMAL CYCLING

BACKGROUND

1. Technical Field

The present invention relates generally to a method, system, and computer program product for managing the temperature of an integrated circuit module. More particularly, the present invention relates to a method, system, and computer program product for on-chip control of thermal cycling of the integrated circuit (IC).

2. Description of the Related Art

Modern day electronics include components that use integrated circuits. Integrated circuits are electronic circuits formed using Silicon as a substrate and by adding impurities to form solid-state electronic devices, such as transistors, diodes, and resistors. Commonly known as a "chip," an integrated circuit is generally encased in hard plastic called the "package." The components in modern day electronics generally appear to be rectangular black plastic pellets with connector pins protruding from the plastic encasement.

Circuit designers use a variety of software tools to design electronic circuits that accomplish an intended task. For example, a digital circuit may be designed to accept digital inputs, perform some computation, and produce a digital output. An analog circuit may be designed to accept analog signals, manipulate the analog signals, such as by amplifying, filtering, or mixing the signals, and produce an analog or digital output. Generally, any type of circuit can be designed as an IC.

Certain voltage is required to operate a component in an IC. For example, a metal oxide field effect transistor (MOSFET) has a gate that operates at a threshold voltage. When the threshold voltage or a higher voltage is applied to the gate the MOSFET is turned on and provides a conductive path. When the voltage applied to the gate is below the threshold voltage the MOSFET is turned off.

When electronic components consume electric power and operate in an IC, they generate heat. Depending on the operations being performed by the IC, components being operated in the IC or speed at which they are being operated, and many other factors, the heat generated from the usage of electric power raises the temperature of the chip. As the operations being performed by the IC change, so does the chip's temperature. The chip's temperature is also a factor of the amount of cooling available at a given time, the type of cooling that is available, and how the heat output of the chip is changing relative to the cooling capacity.

Thermal cycling is the process of repeated heating and cooling due to the changing heat output of the chip, such as when different workloads are executed on the chip. Certain chips, such as microprocessors, experience more thermal cycling than other types of chips. Certain power management techniques employed in the operation of the chips lead to higher power swing and hence more severe and frequent thermal cycles. Recent microprocessors have turbo modes with significantly higher local temperature swing.

SUMMARY

The illustrative embodiments provide a method, system, and computer program product for on-chip control of thermal cycling. An embodiment configures on the IC a first circuit for adjusting a first voltage being applied to a first part of the IC. The embodiment measures a first temperature of the first part at a first time. The embodiment determines that the first temperature is outside a temperature range defined by an upper temperature threshold and a lower temperature threshold. The embodiment adjusts the first voltage by reducing the first voltage when the first temperature exceeds the upper temperature threshold and by increasing the first voltage when the first temperature is below the lower temperature threshold, thereby causing the first temperature of the first part to attain a value within the temperature range.

BRIEF DESCRIPTION OF THE SEVERAL VIEWS OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

The invention recognizes that thermal cycling reduces the reliability of the chip's package and silicon reliability and causes significant reduction in the chip's useful life. Back-end-of-line (BEOL) metal/dielectrics delamination is a phenomenon where layers in the silicon can begin to peel from one another as a result of thermal cycling. C4 is the interface between the silicon chip and its package. C4 fatigue is a phenomenon whereby the chip begins to separate from the package due to the thermal cycling and the differing thermal characteristics of the chip and the package. Underfill is a gel-like material used for filling in the gaps in C4 and for providing physical support to the chip. If the underfill goes through significant thermal cycling, the underfill material becomes progressively harder in a phenomenon called underfill glassification.

These examples are only some of the reasons why thermal cycling adversely affects a chip and its package. Newer lead-free and organic packages are more prone to thermal cycle failures for these and other reasons.

The invention also recognizes that a chip's thermal cycling is a result not only of the chip's operations, but also of the chip's cooling system. Air cooling and liquid cooling are generally slow in adjusting for removing the heat as compared to the speed at which the heat generation by the chip changes. For example, a chip's heat output can increase much faster than the cooling capacity of an air cooling system or a liquid cooling system can be increased. Similarly, the heat output of the chip can reduce at a much faster rate than the rate of reduction of the cooling capacity of the air or liquid cooling systems, which causes the chip to become cooler even faster, thus exacerbating the thermal cycling.

The invention further recognizes that a chip's thermal cycling also degrades the performance and reliability of the cooling system itself. If the switches, water cooling valves, fan motors, and other components of the cooling system are operated, manipulated, switched, or adjusted constantly in an effort to respond precisely to the changing heat output of the chip, those components become fatigued over time. Therefore, the failure rate of the cooling components also increases due to a chip's thermal cycling.

The illustrative embodiments used to describe the invention generally address and solve the above-described problems and other problems related to controlling the thermal cycling of a chip. The illustrative embodiments provide a method, system, and computer program product for managing the thermal cycling of a chip by using a voltage control mechanism fabricated on the chip itself (on-chip control).

The on-chip control is a voltage control device that responds to the changing heat output of the chip such that the temperature of the chip is bound at an upper as well as a lower threshold. In other words, the on-chip control helps manage the chip's temperature such that the chip does not heat up above an upper temperature limit or cool below a lower temperature limit.

Generally, the on-chip control according to an embodiment is significantly faster in responding to the thermal change in the chip as compared to air or liquid cooling mechanisms. Being a more responsive thermal cycling control mechanism, the on-chip control enables tighter control on the temperature of the chip and the package. Being a solid-state fabrication, the on-chip control is also not susceptible to the switching fatigue experienced by fans, pumps, or switches, as in the air or liquid cooling mechanisms.

Furthermore, the on-chip control performs heating or cooling of the chip by adjusting a voltage level that is applied to one or more components within the chip. The on-chip control raises the chips temperature by raising the voltage and reduces the temperature by reducing the voltage that is applied to all or part of the chip.

This manner of operation of the on-chip control for thermal cycling is different from the voltage control that is applied to a chip for power management purposes. For power management, the voltage of the chip is reduced when the chip's utilization is low, i.e., when the chip is already cool. The voltage is raised for power management when the chip's utilization is high, i.e., when the chip is already hot.

The illustrative embodiments are described with respect to certain chips or circuits only as examples. Such descriptions are not intended to be limiting on the invention. For example, an illustrative embodiment described with respect to a microprocessor can be implemented with respect to any other chip that is affected by thermal cycling within the scope of the invention.

The illustrative embodiments are described with respect to certain data, data structures, file-systems, file names, directories, and paths only as examples. Such descriptions are not intended to be limiting on the invention. For example, an illustrative embodiment described with respect to a local application name and path can be implemented as an application on a remote path within the scope of the invention.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention.

The illustrative embodiments are described using specific code, designs, architectures, layouts, schematics, and tools only as examples and are not limiting on the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. An illustrative embodiment may be implemented in hardware, software, or a combination thereof.

The examples in this disclosure are used only for the clarity of the description and are not limiting on the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting on the illustrative embodiments. Additional or different advantages may be realized by specific illustrative embodiments. Furthermore, a particular illustrative embodiment may have some, all, or none of the advantages listed above.

Figure 1:
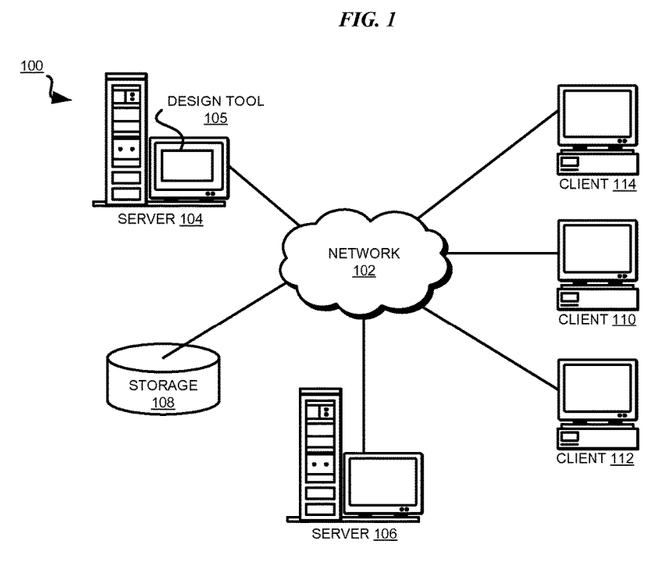
FIG. 1 depicts a pictorial representation of a network of data processing systems in which illustrative embodiments may be implemented.
Figure 2:
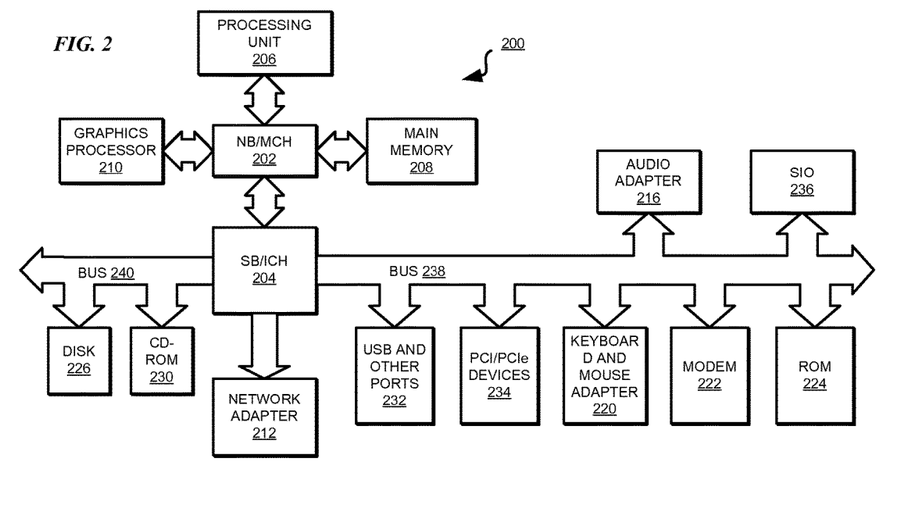
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a pictorial representation of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables. Server 104 and server 106 couple to network 102 along with storage unit 108. Software applications may execute on any computer in data processing environment 100.

In addition, clients 110, 112, and 114 couple to network 102. A data processing system, such as server 104 or 106, or client 110, 112, or 114 may contain data and may have software applications or software tools executing thereon.

Any data processing system, such as server 104, may include application 105 according to an embodiment. Design tool 105 may be any combination of hardware and software usable for designing integrated circuits.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as server 104 or client 110 in FIG. 1, in which computer usable program code or instructions implementing the processes of the illustrative embodiments may be located for the illustrative embodiments.

In the depicted example, data processing system 200 employs a hub architecture including North Bridge and memory controller hub (NB/MCH) 202 and south bridge and input/output (I/O) controller hub (SB/ICH) 204. Processing unit 206, main memory 208, and graphics processor 210 are coupled to north bridge and memory controller hub (NB/MCH) 202. Processing unit 206 may contain one or more processors and may be implemented using one or more heterogeneous processor systems. Graphics processor 210 may be coupled to the NB/MCH through an accelerated graphics port (AGP) in certain implementations.

In the depicted example, local area network (LAN) adapter 212 is coupled to south bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to south bridge and I/O controller hub 204 through bus 238. Hard disk drive (HDD) 226 and CD-ROM 230 are coupled to south bridge and I/O controller hub 204 through bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE) or serial advanced technology attachment (SATA) interface. A super I/O (SIO) device 236 may be coupled to south bridge and I/O controller hub (SB/ICH) 204.

An operating system runs on processing unit 206. The operating system coordinates and provides control of various components within data processing system 200 in FIG. 2. The operating system may be a commercially available operating system such as Microsoft® Windows® (Microsoft and Windows are trademarks of Microsoft Corporation in the United States, other countries, or both), or Linux® (Linux is a trademark of Linus Torvalds in the United States, other countries, or both). An object oriented programming system, such as the Java™ programming system, may run in conjunction with the operating system and provides calls to the operating system from Java™ programs or applications executing on data processing system 200 (Java and all Java-based trademarks and logos are trademarks or registered trademarks of Oracle and/or its affiliates).

Program instructions for the operating system, the object-oriented programming system, the processes of the illustrative embodiments, and applications or programs are located on storage devices, such as hard disk drive 226, and may be loaded into a memory, such as, for example, main memory 208, read only memory 224, or one or more peripheral devices, for execution by processing unit 206. Program instructions may also be stored permanently in non-volatile memory and either loaded from there or executed in place. For example, the synthesized program according to an embodiment can be stored in non-volatile memory and loaded from there into DRAM.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in north bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a PDA.

Figure 3:
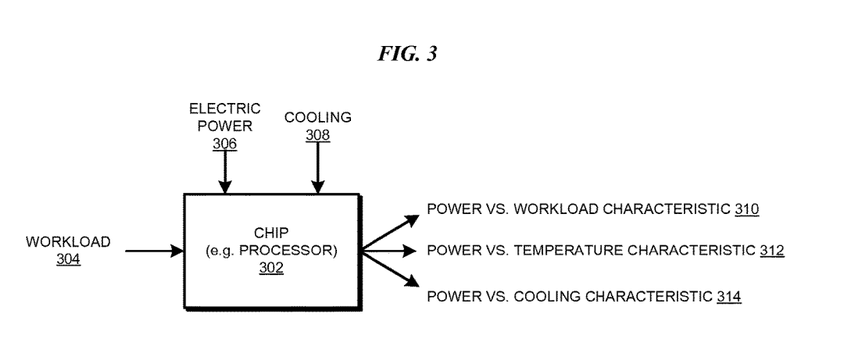
FIG. 3 depicts a block diagram of a thermal and electrical behavior of a chip with respect to which an illustrative embodiment may be implemented.

With reference to FIG. 3, this figure depicts a block diagram of a thermal and electrical behavior of a chip with respect to which an illustrative embodiment may be implemented. Chip 302 may be any IC, such as processing unit 206 in FIG. 2 (processor, or microprocessor).

Chip 302 typically receives workload 304 for executing using chip 302's circuitry. Chip 302 performs workload 304's tasks using electric power 306. Consumption of electric power 306 produces heat in chip 302, which is removed from chip 302 by cooling 308 applied to chip 302.

While consuming electric power 304 to perform workload 302, chip 302 exhibits characteristic 310, which is indicative of chip 302's power consumption changes relative to workload changes. Generally, when workload 304 increases, consumption of electric power 306 also increases.

While consuming electric power 304 to perform workload 302, chip 302 exhibits characteristic 312, which is indicative of chip 302's power consumption changes relative to chip 302's temperature changes. Generally, when consumption of electric power 306 increases, chip 302's temperature also increases.

While consuming electric power 304 to perform workload 302, chip 302 exhibits characteristic 314, which is indicative of chip 302's power consumption changes relative to chip 302's cooling changes. Generally, when consumption of electric power 306 increases, chip 302's cooling 308 is also increased to maintain chip 302's temperature below an upper bound. The increase in cooling 308 generally lags the increase in electric power 306.

Figure 4:
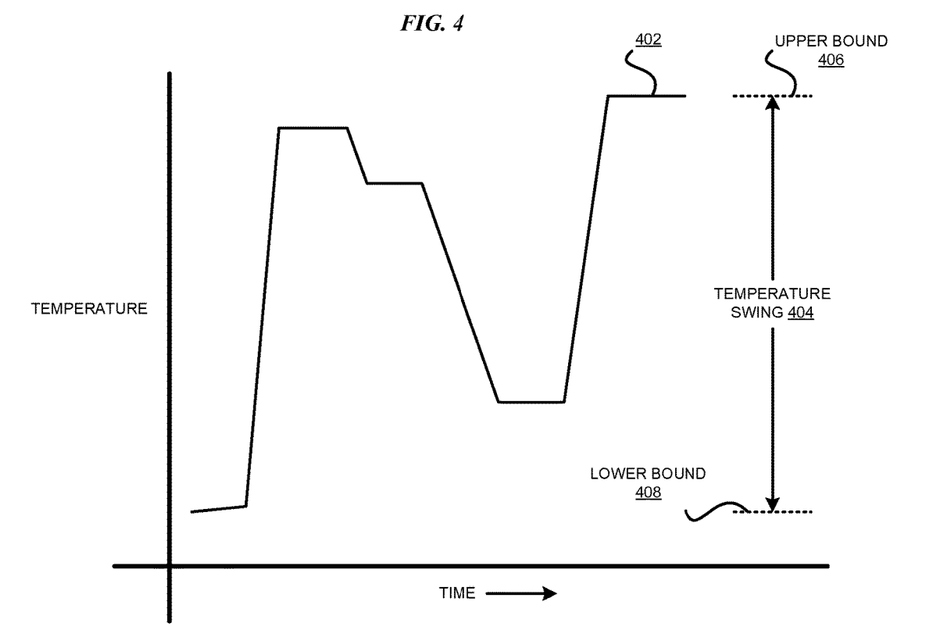
FIG. 4 depicts a simplified graph of temperature swings in a chip in accordance with an illustrative embodiment.

With reference to FIG. 4, this figure depicts a simplified graph of temperature swings in a chip in accordance with an illustrative embodiment. Graph 402 plots the measured temperature of a given chip over a period during which the chip experiences workload changes, power changes, cooling changes, or some combination thereof. Graph 402 may be plotted for any chip, such as chip 302 in FIG. 3, which supports some method of measuring the chip's temperature.

Generally, existing cooling methods for chips provide only an upper bound of the temperature that should not be exceeded. Chips are normally not equipped with heating devices to prevent the chip's temperature from falling below a threshold temperature, and a lower bound for the temperature is therefore not meaningful for chips that utilize presently available thermal cycling control mechanisms.

Presently, when a chip is expected to become idle, a pseudo workload is scheduled to execute on the chip. However, a pseudo workload can be scheduled only to avoid an idle or zero utilization, and not for maintaining a chip's temperature within certain upper and lower bounds. Furthermore, a pseudo workload cannot be dynamically configured to accommodate a present temperature's variation from a previous temperature to stabilize the chip's temperature.

An embodiment operates by injecting power to raise the chip's temperature or reduce power to reduce the chip's temperature. An embodiment allows controlling temperature swing 404 using an on-chip control such that the temperature neither exceeds upper bound 406 nor drops below lower bound 408. The on-chip control adjusts the voltage of all or a part of a chip such that when the chip's temperature is within a tolerance limit of upper bound 406, the voltage is reduced to prevent exceeding upper bound 406. Similarly, the on-chip control adjusts the voltage of all or a part of a chip such that when the chip's temperature is within a tolerance limit of lower bound 408, the voltage is increased to prevent violating lower bound 408.

Figure 5:
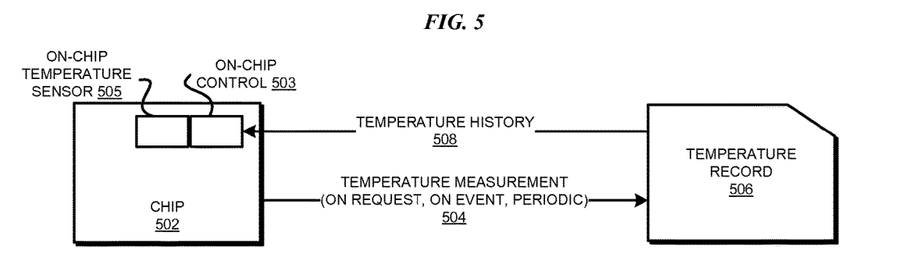
FIG. 5 depicts a block diagram of a temperature measurement record usable for controlling thermal cycling of a chip in accordance with an illustrative embodiment.

With reference to FIG. 5, this figure depicts a block diagram of a temperature measurement record usable for controlling thermal cycling of a chip in accordance with an illustrative embodiment. Chip 502 may be similar to chip 302 in FIG. 3.

Chip 502 includes on-chip control 503 for controlling thermal cycling of all or a part of chip 502. Any number of on-chip controls 503 may be implemented on chip 502 without limitation, such as to control temperature swings and thermal cycling of different parts of chip 502 differently.

Chip 502 includes on-chip temperature sensor 505 for measuring the temperature of all or a part of chip 502. Any number of on-chip temperature sensors 505 may be implemented on chip 502 without limitation, such as to measure temperature of different parts of chip 502 differently.

An embodiment allows not only preventing violating upper and lower bounds of temperatures for a chip, but also maintaining a chip's temperature constant within a narrow temperature band inside those temperature bounds. For example, chip 502 may provide temperature measurement 504 on request, upon some event, or periodically. For example, an application may request a temperature measurement from chip 502, a workload scheduling event or another event may trigger chip 502 to output temperature measurement 504, or a timer elapsing may cause chip 502 to output temperature measurement 504.

Temperature record 506 is a historic record of one or more temperature measurements 504 for a predetermined time period. More than one temperature records 506 may be maintained each for a different portion of chip 502, when chip 502 is configured to take temperature measurements at different portions thereof. Temperature record 506 may be maintained within chip 502 or in another location accessible to on-chip control 503, such as in a memory device used by chip 502. Temperature record 506 may be stored in any suitable form, for example, as delimited data, a data structure, or indexed data.

Temperature history 508 can be provided from temperature record 506 to on-chip control 503. Temperature history 508 may include one or more previous temperature measurements recorded at any previous time without limitation. Temperature history 508 can be used by on-chip control 503 to compare a present temperature measurement to a previous temperature measurement.

For example, chip 502 may be configured to have more than one on-chip control 503 to adjust voltages to different parts of chip 502 differently depending upon the specific temperature conditions existing in those respective parts of chip 502. By comparing the present temperature in one part of chip 502 to a previous temperature in that part, an instance of on-chip control 503 can determine whether the temperature in that part is exhibiting an increasing trend or a decreasing trend. That instance of on-chip control 503 may then perform a voltage adjustment for that part to arrest that temperature change such that the temperature in that part of chip 502 remains approximately stable within a narrow temperature band specified between the upper and the lower bounds of temperature for chip 502.

A narrow band may not be specified within the temperature bounds. An embodiment of on-chip control 503 may perform a voltage adjustment for a part of chip 502 to maintain the temperature in that part of chip 502 within the upper and the lower bounds of temperature, such as upper bound 406 and lower bound 408 in FIG. 4.

Operating in this manner, one or more on-chip controls 503 may prevent one part of chip 502 to overcool or overheat with respect to another part, and generally may avoid temperature imbalances between various parts of chip 502. Controlling thermal cycling, avoiding temperature imbalances, minimizing temperature swings, or stabilizing chip temperature within a band helps achieve improved reliability for silicon, package, as well as external cooling systems used in conjunction with chip 502.

On-chip control 503 can be implemented as any suitable circuit configurable for adjusting voltage in a part of a chip for a given design of the chip. Preferably, on-chip control 503 adjusts the voltage variably within a predetermined limit around a nominal voltage so that reliability of the chip's operations is not a concern. For example, in one embodiment, on-chip control 503 adjusts the voltage above or below a nominal voltage in several steps.

The voltage to a circuit in a chip can vary within some tolerance without affecting the circuit's operations. Normally, a chip is designed to operate correctly within a prescribed range of voltage. Preferably, the voltage control range above or below the nominal voltage, within which on-chip control 503 adjusts the voltage, is chosen such that the change in voltage causes the does not adversely affect the functionality or the performance of the chip or a part thereof.

Figure 6:
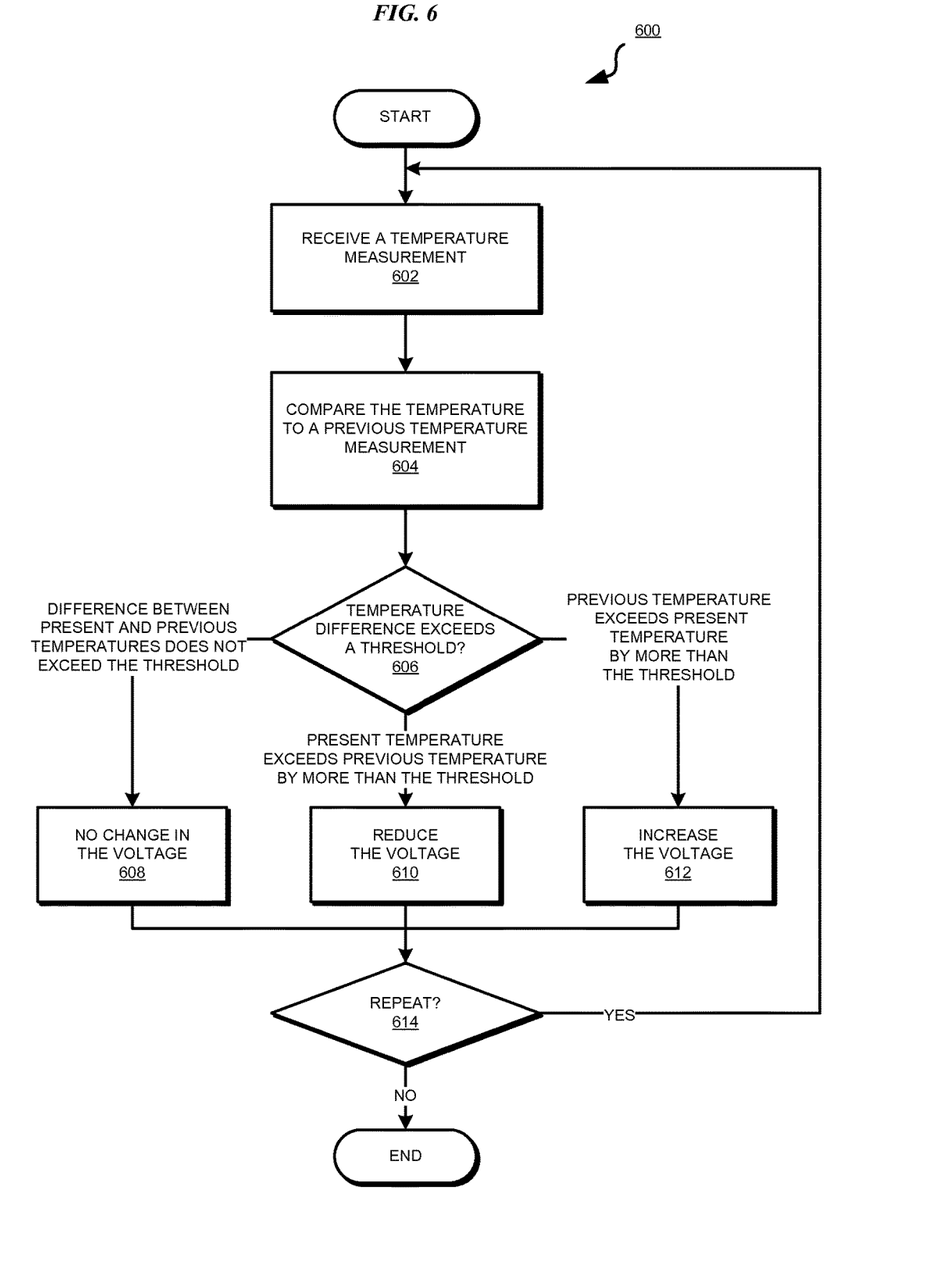
FIG. 6 depicts a flowchart of an example process for on-chip control of thermal cycling in accordance with an illustrative embodiment.

With reference to FIG. 6, this figure depicts a flowchart of an example process for on-chip control of thermal cycling in accordance with an illustrative embodiment. Process 600 may be implemented in an on-chip control, such as on-chip control 503 in FIG. 5.

Process 600 begins by receiving a temperature measurement (step 602). The temperature measurement of step 602 may be a present temperature of the chip generally, or of a part of the chip specifically.

Process 600 compares the temperature measurement of step 602 with a previous temperature measurement, such as a temperature measurement from temperature record 506 in FIG. 5.

Process 600 determines whether the difference between present temperature and the previous temperature exceeds a threshold (step 606). If the difference between the present and the previous temperatures does not exceed the threshold ("Difference between present and previous temperatures does not exceed the threshold" path of step 606), process 600 does not change the voltage (step 608). If the temperature difference exceeds the threshold such that the present temperature is more than the previous temperature by more than the threshold amount ("Present temperature exceeds previous temperature by more than the threshold" path of step 606), process 600 reduces the voltage (step 610). If the temperature difference exceeds the threshold such that the previous temperature is more than the present temperature by more than the threshold amount ("Previous temperature exceeds present temperature by more than the threshold" path of step 606), process 600 increases the voltage (step 612).

Following either step 608, 610, or 612, process 600 determines whether to repeat process 600 (step 614). If the temperature measurements and comparisons have to be repeated ("Yes" path of step 614), process 600 returns to step 602. If not, ("No" path of step 614), process 600 ends thereafter.

Figure 7:
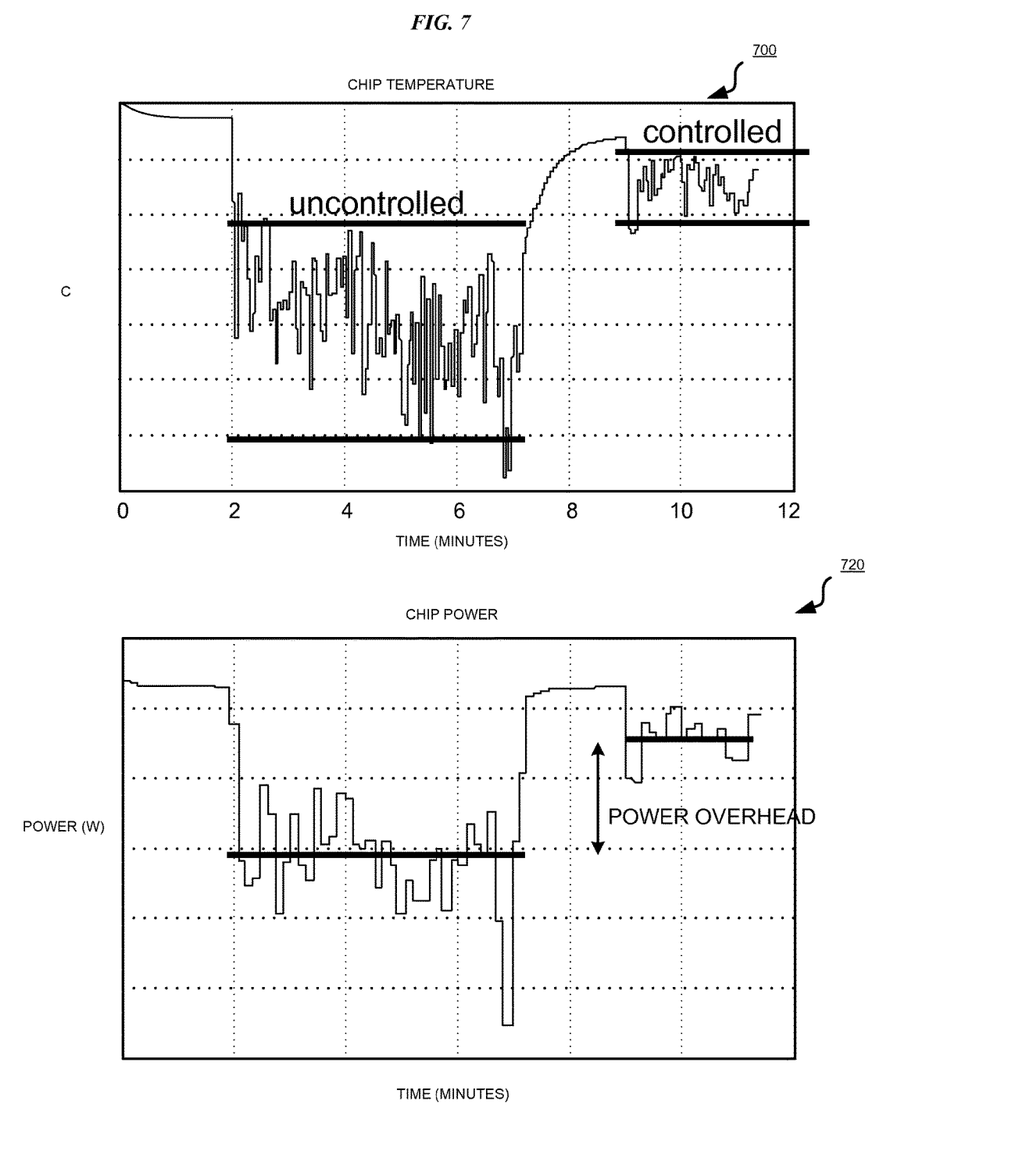
FIG. 7 depicts two graphs that comparatively show the cost and effect of an example implementation of on-chip control of thermal cycling in accordance with an illustrative embodiment.

With reference to FIG. 7, this figure depicts two graphs that comparatively show the cost and effect of an example implementation of on-chip control of thermal cycling in accordance with an illustrative embodiment. Graphs 700 and 720 may be generated by operating on-chip control 503 for chip 502 or a portion thereof in FIG. 5.

Graph 700 plots for a certain time-period the temperature of an example processor chip whose core temperature is measured at a predetermined interval. Graph 700 includes a controlled part and an uncontrolled part. The uncontrolled part of graph 700 plots the temperature changes, perhaps due to changes in the processor's operations, environment, or both, when the on-chip control is not operated.

The controlled part of graph 700 plots the temperature changes, occurring for similar reasons as in the uncontrolled part of graph 700, when the on-chip control is operated.

Notice that the temperature fluctuations are restricted to a much narrower range when the on-chip control is functional. Consequently, when the on-chip control according to an embodiment is used, the chip experiences smaller temperature variations for similar temperature change factors as compared to when an on-chip control according to an embodiment is not used. Thus, the thermal cycling of the chip is better controlled and bound within tighter bounds because of the on-chip control.

Graph 720 plots for the same time-period as graph 700, the electrical power consumed by the example processor chip. The power measurement is performed at the same or different predetermined interval. Graph 720 shows average power consumed 722 during the uncontrolled part of graph 700, and average power consumed 724 during the controlled part of graph 700.

Notice that average power consumed 724 during the controlled part of graph 700 is higher than average power consumed 722 during the uncontrolled part of graph 700. The power overhead shown on graph 720 is the difference between average power consumed 724 during the controlled part of graph 700 and average power consumed 722 during the uncontrolled part of graph 700. The power overhead is the cost of operating the on-chip control in the example processor chip.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, a computer implemented method, system, and computer program product are provided in the illustrative embodiments for on-chip control of thermal cycling in integrated circuits. Using an embodiment of the invention, a voltage adjusting circuit, the on-chip control—can be fabricated on the silicon of the same IC whose thermal cycling has to be controlled. An embodiment operates by manipulating the voltage being supplied to, and thus the power being used by, the IC. An embodiment thus increases the voltage to a portion of the chip when the chip temperature drops or is expected to undesirably, and decreases the voltage when the temperature of the chip rises or is expected to rise undesirably.

An embodiment is faster in responding to the increasing heat output of the chip as compared to the existing cooling solutions. An embodiment is more precise and usable in more situations to raise the chip's temperature as compared to the pseudo workload based currently existing solutions.

An embodiment allows defining a lower temperature bound for the chip being monitored. Thus, by using an embodiment, the chip can be operated not only below a threshold temperature, but also above a second threshold temperature. An embodiment can also allow stabilizing the temperature of the chip or a portion thereof within a band between the two thresholds. An embodiment can also allow keeping the chip's temperature within a defined threshold relative a previous temperature.

An embodiment can help reduce the deterioration of mechanical cooling devices and improve overall system reliability. An embodiment can be configured so that different parts of a chip, such as different cores of a multi-core processor, are monitored for temperature fluctuations by different on-chip controls and each part receives a customized control on that part's thermal cycling.

An embodiment may operate without impairing the chip's operational reliability by adjusting the voltage within an acceptable range above or below a nominal voltage for the given chip. An embodiment may not cause significant performance degradation for an average case implementation.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable storage device(s) or computer readable media having computer readable program code embodied thereon.

Any combination of one or more computer readable storage device(s) or computer readable media may be utilized. The computer readable medium may be a computer readable signal medium or a computer readable storage medium. A computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible device or medium that can contain, or store a program for use by or in connection with an instruction execution system, apparatus, or device.

Program code embodied on a computer readable storage device or computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to one or more processors of one or more general purpose computers, special purpose computers, or other programmable data processing apparatuses to produce a machine, such that the instructions, which execute via the one or more processors of the computers or other programmable data processing apparatuses, create means for implementing the functions/acts specified in the flowchart and/or block diagram block or blocks.

These computer program instructions may also be stored in one or more computer readable storage devices or computer readable media that can direct one or more computers, one or more other programmable data processing apparatuses, or one or more other devices to function in a particular manner, such that the instructions stored in the one or more computer readable storage devices or computer readable medium produce an article of manufacture including instructions which implement the function/act specified in the flowchart and/or block diagram block or blocks.

The computer program instructions may also be loaded onto one or more computers, one or more other programmable data processing apparatuses, or one or more other devices to cause a series of operational steps to be performed on the one or more computers, one or more other programmable data processing apparatuses, or one or more other devices to produce a computer implemented process such that the instructions which execute on the one or more computers, one or more other programmable data processing apparatuses, or one or more other devices provide processes for implementing the functions/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer implemented method for on-chip control of thermal cycling in an integrated circuit (IC), the method comprising:
    configuring on the IC a first circuit for adjusting a first voltage being applied to a first part of the IC;
    measuring a first temperature of the first part at a first time;
    determining that the first temperature is outside a temperature range defined by an upper temperature threshold and a lower temperature threshold;
    comparing the first temperature to a previous temperature, wherein the previous temperature is measured at the first part at a time prior to the first time;
    determining a trend in a temperature change of the first part, wherein the trend is an increasing trend when the first temperature exceeds the previous temperature and the trend is a decreasing trend when the previous temperature exceeds the first temperature; and
    adjusting the first voltage by variably reducing the first voltage from a nominal voltage in several steps when the first temperature exceeds the upper temperature threshold and by variably increasing the first voltage from a nominal voltage in several steps when the first temperature is below the lower temperature threshold, the adjusting slowing the trend and causing the first temperature of the first part to attain a value within the temperature range.

2. The computer implemented method of claim 1, further comprising:
    configuring on the IC a second circuit for adjusting a second voltage being applied to a second part of the IC; and
    performing the measuring, the determining, and the adjusting with respect to a second temperature on the second part of the IC.

3. The computer implemented method of claim 2, wherein adjusting the first voltage by the first circuit is independent of adjusting the second voltage by the second circuit.

4. The computer implemented method of claim 2, wherein the first voltage is adjusted by the first circuit relative to the second voltage such that a temperature difference between the first and the second parts of the IC is within a predefined temperature difference threshold.

5. The computer implemented method of claim 1, wherein the temperature range is narrower than a permissible temperature range, wherein the permissible temperature range is defined by at least one of (i)an upper temperature bound greater than the upper temperature threshold, and (ii) a lower temperature bound lower than the lower temperature threshold, further comprising:
    recording the previous temperature in a temperature record;
    determining, by comparing the first temperature of the first part with the previous temperature from the temperature record, that the first temperature is different from the previous temperature by more than an allowable difference; and
    adjusting the first voltage of the first part to cause the difference between the first temperature and the previous temperature to be no more than the allowable difference.

6. The computer implemented method of claim 5, wherein the temperature record is stored within the IC.

7. The computer implemented method of claim 1, wherein the first part is the entire IC.

8. A computer usable program product comprising a computer usable storage device including computer usable code for on-chip control of thermal cycling in an integrated circuit (IC), the computer usable code comprising:
    computer usable code for configuring on the IC a first circuit for adjusting a first voltage being applied to a first part of the IC;
    computer usable code for measuring a first temperature of the first part at a first time;
    computer usable code for determining that the first temperature is outside a temperature range defined by an upper temperature threshold and a lower temperature threshold;
    comparing the first temperature to a previous temperature, wherein the previous temperature is measured at the first part at a time prior to the first time;
    determining a trend in a temperature change of the first part, wherein the trend is an increasing trend when the first temperature exceeds the previous temperature and the trend is a decreasing trend when the previous temperature exceeds the first temperature; and
    computer usable code for adjusting the first voltage by variably reducing the first voltage from a nominal voltage in several steps when the first temperature exceeds the upper temperature threshold and by variably increasing the first voltage from a nominal voltage in several steps when the first temperature is below the lower temperature threshold, the adjusting slowing the trend and causing the first temperature of the first part to attain a value within the temperature range.

9. The computer usable program product of claim 8, further comprising:
    computer usable code for configuring on the IC a second circuit for adjusting a second voltage being applied to a second part of the IC; and
    computer usable code for performing the measuring, the determining, and the adjusting with respect to a second temperature on the second part of the IC.

10. The computer usable program product of claim 9, wherein adjusting the first voltage by the first circuit is independent of adjusting the second voltage by the second circuit.

11. The computer usable program product of claim 9, wherein the first voltage is adjusted by the first circuit relative to the second voltage such that a temperature difference between the first and the second parts of the IC is within a predefined temperature difference threshold.

12. The computer usable program product of claim 8, wherein the temperature range is narrower than a permissible temperature range, wherein the permissible temperature range is defined by at least one of (i)an upper temperature bound greater than the upper temperature threshold, and (ii) a lower temperature bound lower than the lower temperature threshold, further comprising:
    computer usable code for recording the previous temperature in a temperature record;
    computer usable code for determining, by comparing the first temperature of the first part with the previous temperature from the temperature record, that the first temperature is different from the previous temperature by more than an allowable difference; and computer usable code for adjusting the first voltage of the first part to cause the difference between the first temperature and the previous temperature to be no more than the allowable difference.

13. The computer usable program product of claim 12, wherein the temperature record is stored within the IC.

14. The computer usable program product of claim 8, wherein the first part is the entire IC.

15. The computer usable program product of claim 8, wherein the computer usable code is stored in a computer readable storage medium in a data processing system, and wherein the computer usable code is transferred over a network from a remote data processing system.

16. The computer usable program product of claim 8, wherein the computer usable code is stored in a computer readable storage medium in a server data processing system, and wherein the computer usable code is downloaded over a network to a remote data processing system for use in a computer readable storage medium associated with the remote data processing system.

17. An integrated circuit (IC), comprising:
an on-chip control circuit configured for adjusting a first voltage being applied to a first part of the IC; and
a temperature sensor for measuring a first temperature of the first part at a first time;
the on-chip control circuit determining that the first temperature is outside a temperature range defined by an upper temperature threshold and a lower temperature threshold;
comparing the first temperature to a previous temperature, wherein the previous temperature is measured at the first part at a time prior to the first time;
determining a trend in a temperature change of the first part, wherein the trend is an increasing trend when the first temperature exceeds the previous temperature and the trend is a decreasing trend when the previous temperature exceeds the first temperature; and
the on-chip control circuit adjusting the first voltage by variably reducing the first voltage from a nominal voltage in several steps when the first temperature exceeds the upper temperature threshold and by variably increasing the first voltage from a nominal voltage in several steps when the first temperature is below the lower temperature threshold, the adjusting slowing the trend and causing the first temperature of the first part to attain a value within the temperature range.

18. The IC of claim 17, further comprising:
a second on-chip control circuit for adjusting a second voltage being applied to a second part of the IC; and
a second temperature sensor for performing the measuring, the determining, and the adjusting with respect to a second temperature on the second part of the IC.

19. The IC of claim 18, wherein adjusting the first voltage by the first circuit is independent of adjusting the second voltage by the second circuit.

20. The IC of claim 18, wherein the first voltage is adjusted by the first circuit relative to the second voltage such that a temperature difference between the first and the second parts of the IC is within a predefined temperature difference threshold.

* * * * *